United States Patent [19]

Imamura et al.

[11] Patent Number: 4,902,635

[45] Date of Patent: Feb. 20, 1990

[54] METHOD FOR PRODUCTION OF COMPOUND SEMICONDUTOR DEVICES

[75] Inventors: Yoshinori Imamura; Masaru Miyazaki; Akihisa Terano; Nobutoshi Matsunaga; Hiroshi Yanazawa, all of Kokubunji, Japan

[73] Assignee: The Agency of Industrial Science and Technology, Tokyo, Japan

[21] Appl. No.: 175,704

[22] Filed: Mar. 31, 1988

[30] Foreign Application Priority Data

Dec. 18, 1987 [JP] Japan .................. 62-318541

[51] Int. Cl.$^4$ .............. H01L 21/285; H01L 21/316; H01L 21/318; H01L 29/80

[52] U.S. Cl. .................. 437/44; 437/49; 437/50; 437/58; 437/176; 437/236; 437/240; 437/912; 437/944

[58] Field of Search .......... 437/175, 176, 944, 912, 437/29, 39, 40, 41, 44, 49, 50, 58, 236, 240, 241, 243; 357/22

[56] References Cited

U.S. PATENT DOCUMENTS

| | | | |
|---|---|---|---|
| 4,149,307 | 3/1979 | Henderson | 437/944 |
| 4,201,997 | 5/1980 | Darley et al. | 357/15 |
| 4,353,935 | 10/1982 | Symersky | 437/944 |
| 4,532,004 | 7/1985 | Akiyama et al. | 437/176 |
| 4,546,540 | 10/1985 | Ueyanagi et al. | 437/912 |
| 4,628,338 | 12/1986 | Nakayama et al. | 357/15 |
| 4,701,646 | 10/1987 | Richardson | 357/19 |
| 4,711,858 | 12/1987 | Harder et al. | 437/176 |
| 4,757,033 | 7/1988 | Ebata | 437/944 |
| 4,777,517 | 10/1988 | Onodera et al. | 357/22 |

FOREIGN PATENT DOCUMENTS

| | | | |
|---|---|---|---|
| 0005351 | 11/1979 | European Pat. Off. | 357/22 |
| 0081955 | 7/1981 | Japan | 437/944 |
| 0060854 | 4/1982 | Japan | |
| 0054480 | 3/1985 | Japan | 437/912 |
| 0048509 | 9/1985 | Japan | 437/944 |
| 0056462 | 3/1986 | Japan | 437/912 |

*Primary Examiner*—Olik Chaudhuri
*Attorney, Agent, or Firm*—Pennie & Edmonds

[57] ABSTRACT

This invention is related to the method for production of semiconductor devices suitable for increasing the integration density of semiconductor integrated circuits, especially GaAs semiconductor IC devices.

This invention uses no third wiring metal, contact hole or through hole for connection between the Schottky junction and ohmic electrodes formed on the GaAs semiconductor substrate required in the conventional technology, but provides the method for direct connection between the two electrodes stated above by means of vapor deposition, ion implantation, sputtering, CVD, plasma CVD, dry etching and wet etching.

Since the application of this invention enables the two electrodes stated above to be directly connected with high yield, the element area at the connecting portion can be reduced to less than half as compared with the same required in the conventional method, the total element area can be reduced greatly.

15 Claims, 2 Drawing Sheets

METHOD FOR PRODUCTION OF COMPOUND SEMICONDUTOR DEVICES

FIELD OF THE INVENTION

This invention is concerned with the semiconductor integrated circuit device and is, especially, related to the production method of semiconductor devices suitable for high density integration in GaAs integrated circuit devices.

DESCRIPTION OF PRIOR ART

For connecting the Schottky junction electrodes with ohmic electrodes formed in the active layer in the conventional semiconductor device, an interlayer insulation film was formed wholly after the formation of Schottky and ohmic electrodes, and then, contact holes were provided at specified places in the interlayer insulation film and metal wiring connection through these holes was used, as described in Japanese Patent Laying-Open Nos. 60-34069 and 60-57980.

The conventional technology stated above did not take the increase in element area by contact hole formation into consideration, so it was a problem that the chip size was not able to be reduced when forming a GaAs IC with a high degree of integration density.

SUMMARY OF THE INVENTION

The purpose of this invention is to supply the compound semiconductor device with a small element size by directly connecting the Schottky electrodes and ohmic electrodes formed on the semiconductor substrate at a high yield ratio, using neither the third wiring metal other than these electrodes nor contact or through holes.

The above purpose can be attained by directly connecting ohmic electrodes on Schottky electrodes. FIG. 1 (a) is a plan explaining an embodiment of this invention. FIG. 1 (b) is the circuit diagram for FIG. 1 (a). As apparent from these figures, gate electrode 1' of the first MESFET (metal semiconductor field effect transistor) T1 having the Schottky junction gate electrode and source electrode 2 (ohmic electrodes) and gate electrode 1 of the second MESFET T2 are directly connected by ohmic electrode 2 without the aid of contact holes and wiring layer. The area for contact hole formation is unnecessary to enable the chip area to be reduced.

FIG. 2 shows sectional view of AA' in FIG. 1 (a). Ohmic electrode 2 is in ohmic contact with n-type high-density layer (n+ layer) 3 of MESFET T2 to serve as the source electrode and is also directly connected to gate metal 1 and 1' of MESFETs T1 and T2. As a result, contact holes and the connecting wiring layer are unnecessary to reduce the element area considerably. Side wall 5 consisting of an insulating film is formed in tapered form adjacent each side of the gate metal to prevent disconnection at the wiring portion where ohmic electrode 2 rides over the gate metal.

Surface protecting film 6 consists of the material allowing selective isotropic etching against side wall 5 to make side wall 5 remain unetched when surface protecting film 6 is removed by etching at the portion where ohmic electrode 2 is formed.

Since this invention enables the Schottky joint metals and ohmic electrodes formed on the compound semiconductor device to be connected directly at high yield without using the contact holes and wiring metal layer, the element area can be reduced. The element area at the connecting portion can be reduced to less than one half as compared with the case using the contact holes and wiring metal. Furthermore, the side wall formed for the Schottky joint metal in this invention makes the ohmic electrode overriding the Schottky junction metal in tapered shape, and enables high yield connection without the fear of disconnection.

Figure 1A:
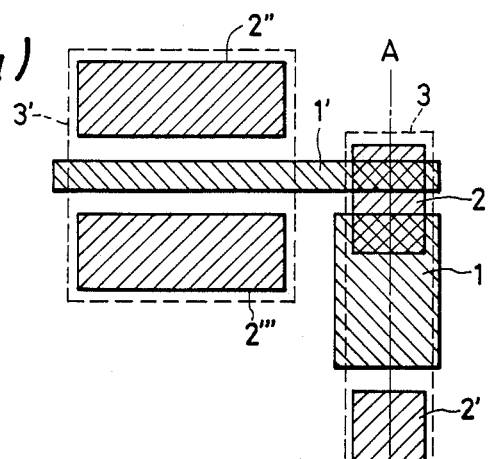
FIGS. 1A and 1B show the plan of the element in which the direct connection between ohmic electrodes and Schottky junction metal is made.
Figure 1B:
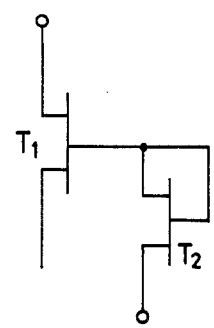
Figure 2:
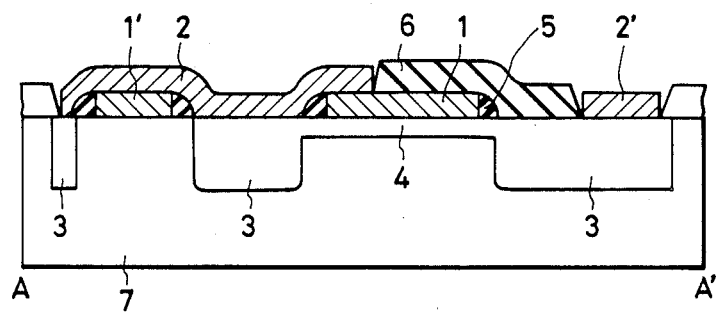
FIG. 2 shows sectional view of AA' in FIG. 1.

1, 1', 12—Schottky junction metal
2, 2', 2'', 21'—Ohmic electrode
3, 3', 16—High density activated layer
4, 11—Active layer
5, 14—Side wall
6, 17—Surface protecting film
15, 18—Photo resist

DETAILED DESCRIPTION OF PREFERRED EMBODIMENTS

Embodiments of this invention are explained below for the cases where GaAs is used as the semiconductor substrate. This invention, however, is applicable to other III-V group compound semiconductors such as InP, InGaAs, AlGaAs, InAlAs and InGaAsP.

Embodiment 1.

Figure 3A:
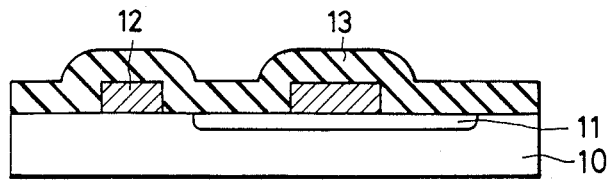
FIGS. 3A-3G show the process flow sheet for embodiment 1 of this invention.
Figure 3B:
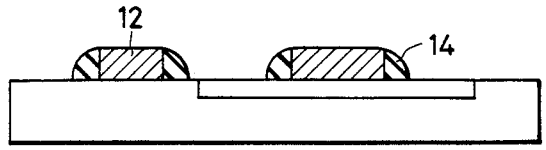
Figure 3C:
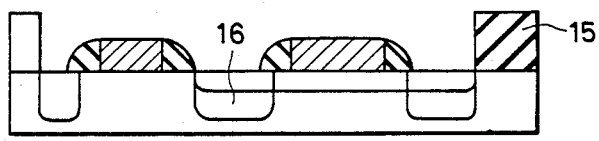
Figure 3D:
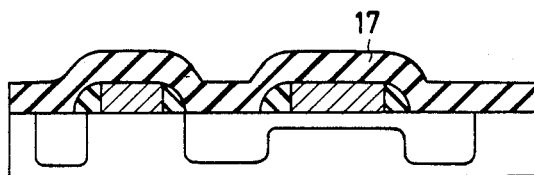
Figure 3E:
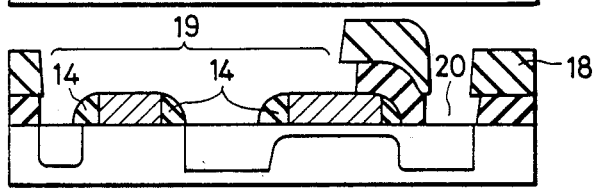
Figure 3F:
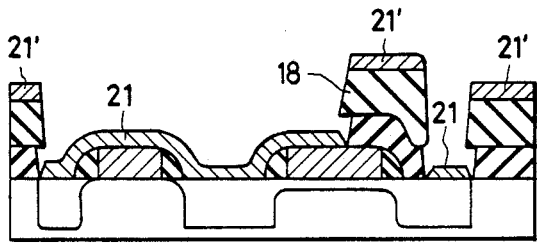
Figure 3G:
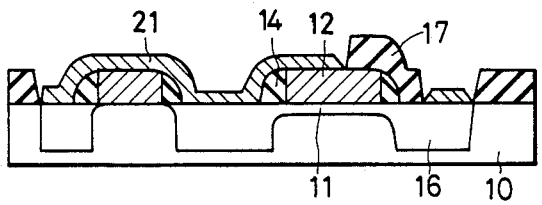

FIG. 3 (a) through (g) shows the production process flow sheet for embodiment 1. In FIG. 3 (a), side wall material 13 is deposited after forming active layer 11 and Schottky junction metal 12 on semi-insulating GaAs substrate 10.

The active layer 11 is formed by annealing at 800° C. for 20 minutes in hydrogen atmosphere with the SiO2 film as the cap film after implanting $2 \times 10^{12}$ pcs/cm$^2$ of Si+ ions to the specified place at an accelerating voltage of 50 KV by ion implantation process. Schottky junction metal 12 is formed by the dry etching using fluoride gas (NF$_3$, CF$_4$, SF$_6$, etc.) with the photo resist as the mask after depositing refractory metal, tungsten silicide to a film thickness of 300 nm by the sputtering process. As insulating film 13, the material, having selectivity against the etching of surface protecting film 17 in FIG. 3 (d), such as SiOxNy (silicon oxynitride) having refractive index n=1.75 for example is suitable (thickness 300 nm). SiOxNy can be formed by the ordinary plasma CVD (plasma excited chemcial vapor deposition) method using monosilane SiH$_4$, nitrogen N$_2$ and nitrous oxide N$_2$O as reaction gases. The SiOxNy film with a refractive index of 1.75 can be formed by ordinary parallel plate plasma CVD (plasma excited chemical vapor deposition) by setting the reaction gas mixing ratio to be SiH$_4$:N$_2$:N$_2$O=15:36:20, total pressure to 5 Pa and discharge power to 100 W (electrode diameter: 40 cm).

In FIG. 3 (b), side wall 14 is formed by etching the above SiOxNy film by the anisotropic dry etching process using CHF$_3$+CF$_4$ gas. In FIG. 3 (c), high density activated layer 16 is formed by the ion implantation process with photo resist 15 as the mask. $3 \times 10^{13}$ pcs/cm$^2$ of Si+ ions are implanted with the implanting energy at 150 KV. In FIG. 3 (d), silicon dioxide (SiO$_2$) is deposited to a film thickness of 300 nm by the chemical vapor deposition process under atmospheric pressure. With this film as surface protecting film 17, the said high density layer is activated by annealing at 800° C. in hydrogen atmosphere for 15 minutes to form the source drain area. In FIG. 3 (e), the opening provided in the above surface protecting film 17 with the photo resist as the mask. Provide at least one opening continuously connecting the upper part of the specified portion of the above high density activated layer and Schottky junction electrodes. In FIG. 3 (e), opening 20 only covers the upper part of the high density activated layer while opening 19 continuously covers the upper sides of high density activated layer 16 and specified portion of Schottky electrode 12. Openings 19 and 20 are processed by a combination of anisotropic dry etching and isotropic wet etching. At first, surface protecting film 17 consisting of silicon dioxide (SiO$_2$) is removed by anisotropic etching under the dry etching conditions at the CHF$_3$ and C$_2$F$_6$ gas flow rates of 100 cc/min and 60 cc/min, respectively, and a high frequency discharge power of 300 W (electrode diameter: 20 cm). It is desirable to keep the over etch amount of dry etching at around 200 to 1000 Å to leave side wall 14. Then apply isotropic etching of surface protecting film 17 using buffer hydrofluoric acid (water: hydrofluoric acid: ammonium fluoride=1:1:12) for side etching of 500 to 3000 Å, preferably in a range between 500 Å and 1500 Å. The purpose of this side etching is for lifting off ohmic electrode 21 with good precision in FIG. 3 (g). The etching speed of surface protecting 17 by the above buffer hydrofluoric acid is approximately 2500 Å/min. On the other hand, the etching speed of side wall 14 consisting of SiOxNy with refractive index of 1.75 by the above buffer hydrofluoric acid is approximately 250 Å/min which is one digit less than the etching speed of above surface protecting film 17. Therefore when surface protecting film 17 is applied with side etching to 500 to 3000 Å by the buffer hydrofluoric acid, side wall 14 remains almost unetched.

Then the process in FIG. 3 (f) starts. Here, ohmic electrodes 21 and 21' consisting of AuGe (600 Å)/W (1000 Å)/Ni (100 Å)/Au (1500 Å) are vapor-deposited on the whole surface of the wafer provided with openings in the process shown in FIG. 3 (e). Ohmic electrode 21 deposited on openings 19 and 20 and ohmic electrode 21 deposited on photo resist 18 are perfectly disconnected by the effect of side etching for the openings of surface protecting film 17 formed in FIG. 3 (e). The wafer vapor-deposited with the above ohmic electrodes is immersed in resist removing agent to remove unnecessary ohmic electrodes 21' by lift off. Then 3-minute alloying at 400° C. in nitrogen atmosphere is conducted for 3 minutes to establish ohmic contact between the ohmic electrodes and high density activated layer. FIG. 3 (g) shows the result.

By the processes described above, the Schottky junction electrodes, ohmic electrodes and high density activated layer formed on the GaAs substrate are directly connected without using the conventional contact holes and wiring metal. In this method, side wall 14 provided adjacent each side of Schottky joint metal serves as a spacer at the portion where the ohmic electrode rides over the Schottky joint metal, and prevent disconnection of the ohmic electrode. This embodiment shows that the ohmic electrodes, high density activated layer and Schottky joint metal are connected with good yield without requiring the conventional contact holes and wiring metal, thus reducing the required element area.

Embodiment 2.

The process flow in this embodiment is the same as the one shown in FIG. 3 explained for embodiment 1 except that side wall 14 formed beside the Schottky junction metal is made of boron nitride (BN). The boron nitride film is formed either by the sputtering process using ordinary Ar discharge or by the plasma chemical vapor deposition process using B$_2$H$_6$ gas and N$_2$ or NH$_3$ gas. The anisotropic etching for BN film side wall formation in FIG. 3 (b) uses anisotropic dry etching under the conditions of CF$_4$ gas flow rate at 100 cc/min, pressure at 5 Pa and high frequency power at 100 W (electrode diameter:20 cm). The BN film formed either by the sputtering process or plasma chemical vapor deposition process described above involves extremely slow ethcing speed by the buffer hydrofluoric acid at 10 Å/min or less, the side etching shown in FIG. 3 (e) is easily performed without etching side wall 14 formed by the BN film when silicon dioxide (SiO$_2$), PSG glass, BPSG glass or SiOxNy (silicon oxynitride) is used as surface protecting film 17. Since side wall 14 remain almost unetched in this embodiment, the connection between ohmic electrodes and Schottky junction metals is formed at a high yield without disconnection at the override portion.

What is claimed is:

1. A method for producing compound semiconductor devices which comprises: forming Schottky junction electrodes made of refractory metal on a semiconductor substrate; forming side walls consisting of a first insulating film adjacent to each side of said Schottky junction electrodes; selectively forming an N or P type active layer partially on the top surface of the said semiconductor; covering the whole surface of said semiconductor substrate with a second insulating film; providing openings in the said second insulating film above first predetermined portions of the said N or P type active layer and continuous openings above second predetermined portions of said N or P type active layer and above said Schottky junction electrodes; coating an ohmic electrode material for an ohmic junction with said N or P type active layers on the whole surface of the said semiconductor substrate; lifting-off the ohmic electrode portion coated on other than said opening; and alloying said ohmic electrode to the N or P type active layer and the Schottky junction electrodes at said openings to provide a direct ohmic junction therebetween.

2. The method of claim 1 in which said second insulating film consists of at least one material for allowing selective isotropic etching with reference to said first insulating film.

3. The method of claim 1 in which said first insulating film consists of at least one of silicon nitride or silicon oxynitride and said second insulating film consists of at least one material selected from the group of silicon dioxide, PSG glass and BPSG glass.

4. The method of claim 1 in which said first insulating film consists of boron nitride and said second insulating film consists of at least one material selected from the group of PSG glass, BPSG glass, silicon oxynitride and silicon dioxide.

5. The method of claim 1 in which said first insulating film consists of at least one material selected from the group of silicon dioxide, silicon nitride, silicon oxynitride, boron nitride, PSG glass and BPSG glass, and said second insulating film consists of aluminum nitride.

6. A method for producing compound semiconductor devices which comprises: depositing sidewall material consisting of a first insulating material in a tapered shape adjacent to each side of Schottky junction electrodes made of refractory metal on a semiconductor substrate; selectively forming an N or P type active layer partially on said semiconductor top surface, said selectively forming excludes the portions containing said Schottky junction electrodes; covering the entire surface of said semiconductor substrate with a second insulating film; coating a photoresist on said second insulating film; providing a continuous opening in said photoresist above predetermined portions of said N or P type active layer and above said Schottky junction electrodes; removing the said second insulating film exposed at said opening using said photoresist as a mask; depositing an ohmic electrode material on the entire surface of said semiconductor substrate; lifting-off the ohmic electrode portions, which are coated on other than said opening by removing said photoresist; and alloying said ohmic electrode to the N or P type active layer and Schottky junction electrodes, thereby providing a direct junction between said N or P type active layer and said Schottky electrodes without using conventional contact holes and wiring, wherein the ohmic electrode overriding the Schottky junction electrode tapered sidewalls enables a high yield connection to be achieved.

7. The method of claim 6 in which said second insulating film consists of at least one material for allowing selective isotropic etching with reference to said first insulating film.

8. The method of claim 6 in which said first insulating film consists of at least one of silicon nitride or silicon oxynitride and said second insulating film consists of at least one material selected from the group of silicon dioxide, PSG glass and BPSG glass.

9. The method of claim 6 in which said first insulating film consists of boron nitride and said second insulating film consists of at least one material selected from the group of PSG glass, BPSG glass, silicon oxynitride and silicon dioxide.

10. The method of claim 6 in which said first insulating film consists of at least one material selected from the group of silicon dioxide, silicon nitride, silicon oxynitride, boron nitride, PSG glass and BPSG glass, and said second insulating film consists of aluminum nitride.

11. The method of claim 6 wherein the photoresist is removed by immersing in resist removing agent and where the alloying step is carried out by heating the semiconductor device in a nitrogen atmosphere.

12. The method of claim 7 wherein the second insulating film is removed by a combination of anisotropic dry etching and isotropic wet etching.

13. The method of claim 7 in which selective isotropic etching forms disconnected portions of said ohmic electrode material deposited on the top surface of said substrate to facilitate removal of said ohmic electrode material portions on said photoresist, the first disconnected portion consists of said ohmic electrode material deposited on said opening and the second disconnected portion of said ohmic electrode material is deposited on said photoresist.

14. A method for producing compound semiconductor devices which comprises: forming Schottky junction electrodes by depositing refractory metal over an entire semi-insulating GaAs substrate and applying photoresist and dry etching; depositing first insulating material on the said substrate and Schottky junction electrodes, and anisotropic dry etching to form tapered side walls consisting of said first insulating material adjacent to each side of the said Schottky junction electrodes; selectively forming an N or P type active layer partially on the top surface of said substrate by ion implantation with photoresist as the mask; covering the entire top surface of said semiconductor substrate with a second insulating film, said second insulating film consists of a material for allowing selective isotropic etching with reference to said first insulating material; coating a photoresist on said second insulating film; providing at least one continuous opening in said photoresist above predetermined portions of said N or P type active layer and above said Schottky junction electrodes; removing the said second insulating film at said opening using anisotropic dry etching and isotropic wet etching with said photoresist as a mask; depositing an ohmic electrode material on the entire top surface of said substrate; lifting off ohmic electrode portions which are coated on other than said opening by removing said photoresist; and alloying said ohmic electrode to the N or P type active layer and Schottky junction electrodes, thereby providing a direct junction between said N or P type active layer and said Schottky junction electrodes without using conventional contact holes and wiring, wherein the ohmic electrode overriding the Schottky junction electrodes tapered side walls enables a high yield connection to be achieved.

15. The method of claim 14 in which selective isotropic etching forms disconnected portions of said ohmic electrode material deposited on the top surface of said substrate to facilitate removal of said ohmic electrode material portions on said photoresist, the first disconnected portion consists of said ohmic electrode material deposited on said opening and the second disconnected portion of said ohmic electrode material is deposited on said photoresist.

* * * * *